US006430109B1

(12) United States Patent
Khuri-Yakub et al.

(10) Patent No.: US 6,430,109 B1
(45) Date of Patent: Aug. 6, 2002

(54) ARRAY OF CAPACITIVE MICROMACHINED ULTRASONIC TRANSDUCER ELEMENTS WITH THROUGH WAFER VIA CONNECTIONS

(75) Inventors: Butrus T. Khuri-Yakub, Palo Alto; F. Levent Degertekin, Millbrae; Sam Calmes, Mountain View; Xuecheng Jin, Stanford, all of CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/667,203

(22) Filed: Sep. 21, 2000

Related U.S. Application Data

(60) Provisional application No. 60/158,254, filed on Sep. 30, 1999.

(51) Int. Cl.⁷ .............................................. H04R 19/00
(52) U.S. Cl. ..................................................... 367/181
(58) Field of Search ................................ 367/181, 174, 367/163

(56) References Cited

U.S. PATENT DOCUMENTS

| | | | |
|---|---|---|---|
| 5,619,476 A | 4/1997 | Haller et al. ................. | 367/181 |
| 5,870,351 A | 2/1999 | Ladabaum et al. .......... | 367/163 |
| 5,894,452 A | 4/1999 | Ladabaum et al. .......... | 367/163 |
| 5,982,709 A | * 11/1999 | Ladabaum et al. .......... | 367/174 |

FOREIGN PATENT DOCUMENTS

FR   2 721 471   6/1994

OTHER PUBLICATIONS

Jin et al., Fabrication and Characterization of Surface Micromachined Capacitive Ultrasonic Immersion Transducers, Mar. 1999, IEEE Journal of Microelectromechanical Systems, vol. 8, No. 1, pp. 100–114.*

Bozkurt, Theory and analysis of Electrode Size Optimization for Capacitive Microfabricated Ultrasonic Transducers, Nov. 1999, IEEE Transactions on Ultrasonics, Ferroelectrics and Frequency Control, vol. 46, No. 6, pp. 1364–1374.*

Calmes, et al. "Highly Integrated 2–D Capacitive Micromachined Ultrasonic Transducers", *IEEE Ultrasonics Symposium*, Oct. 1999, 1163–1166.

* cited by examiner

*Primary Examiner*—Daniel T. Pihulic
(74) *Attorney, Agent, or Firm*—Dorsey & Whitney LLP

(57) ABSTRACT

There is described a cMUT array with transducer elements which include a plurality of cells with membranes formed on one surface of a wafer. Voltages applied between said spaced electrodes drive said membranes. The voltages applied to said electrodes are applied from the opposite surface of the wafer through the wafer and through vias formed in the wafer.

12 Claims, 5 Drawing Sheets

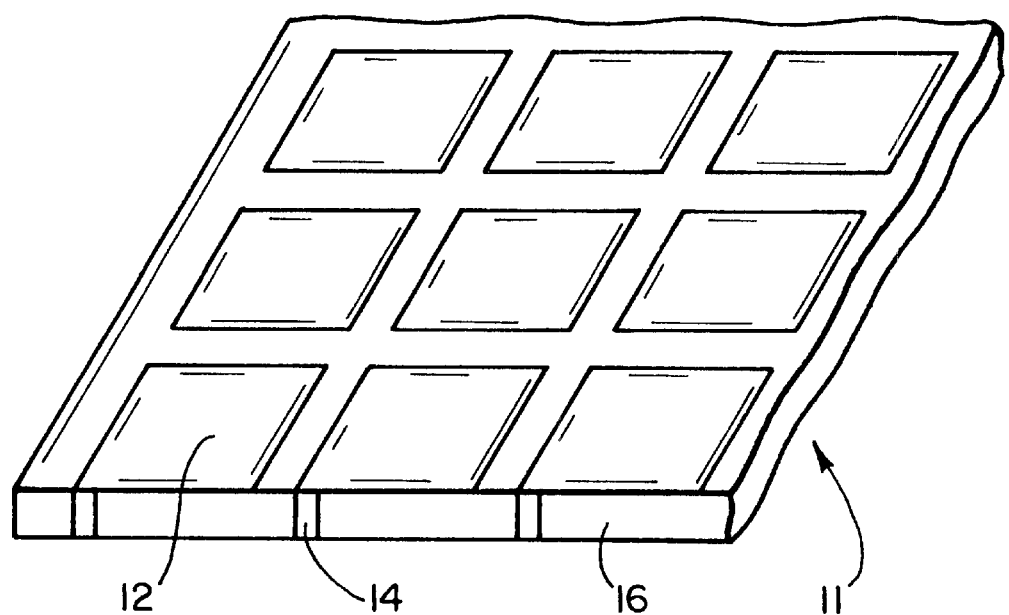
FIG_1
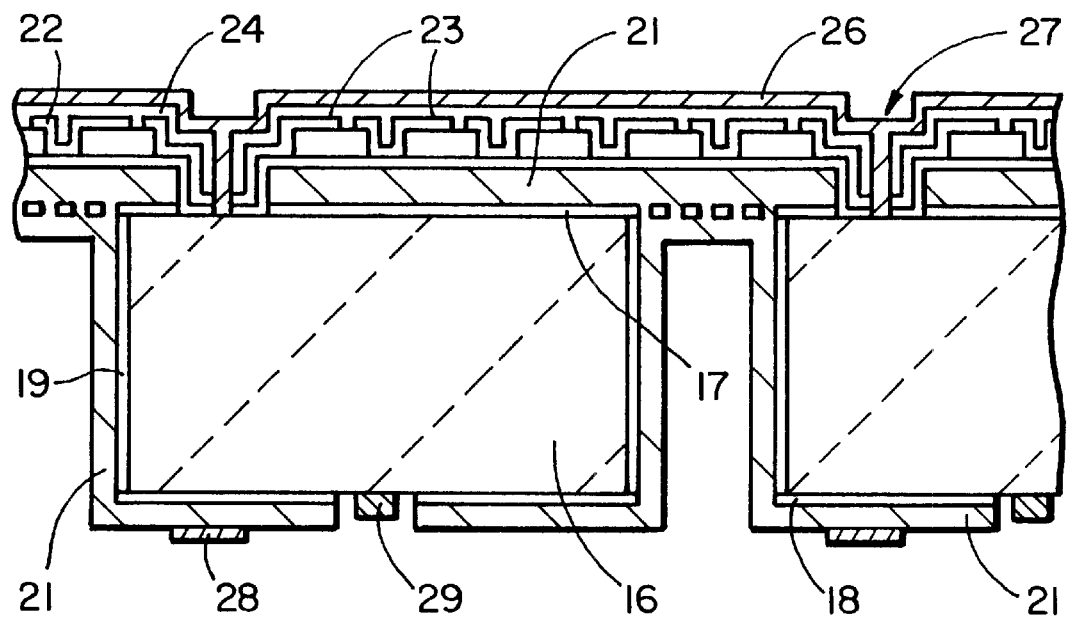
FIG_2

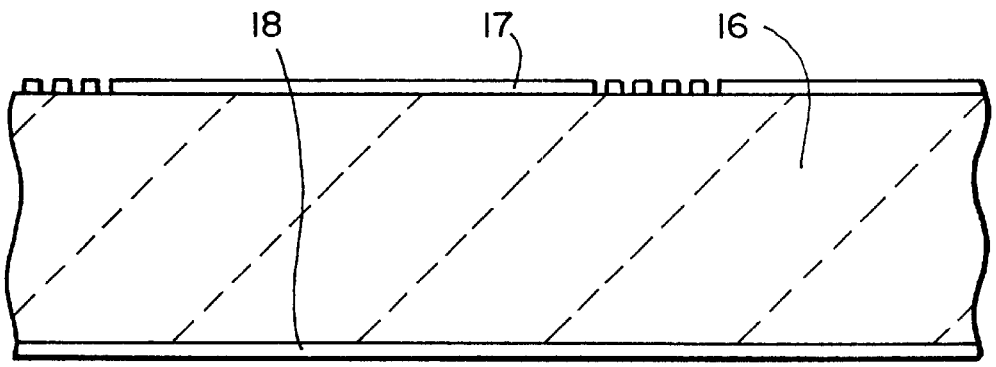
FIG_3.1
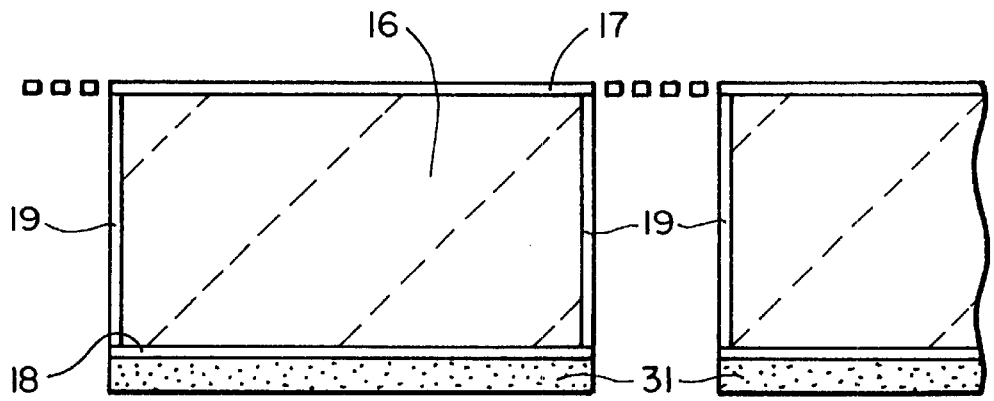
FIG_3.2
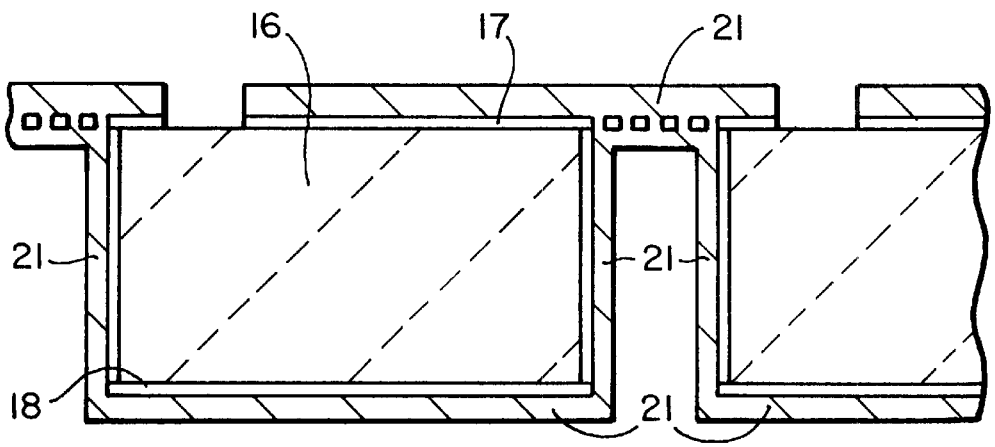
FIG_3.3

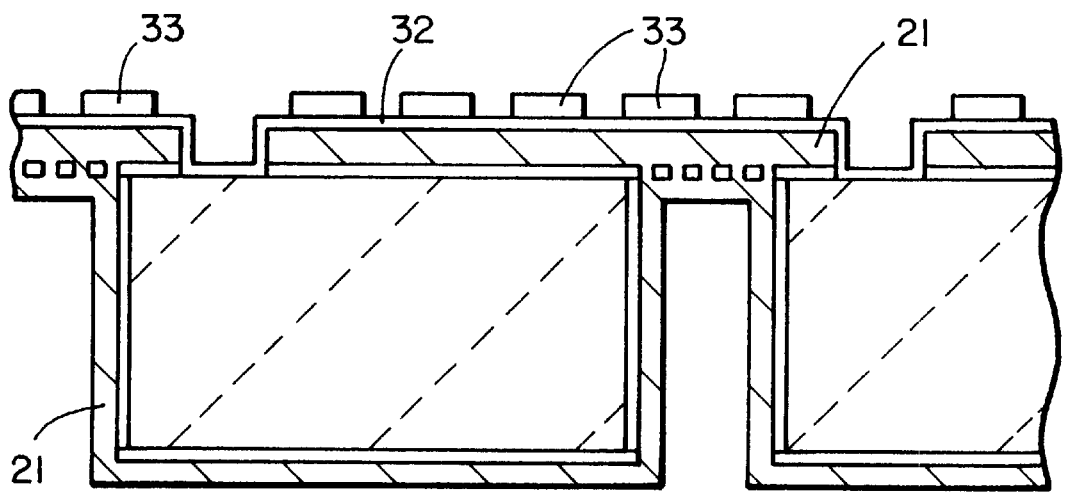
FIG_3.4
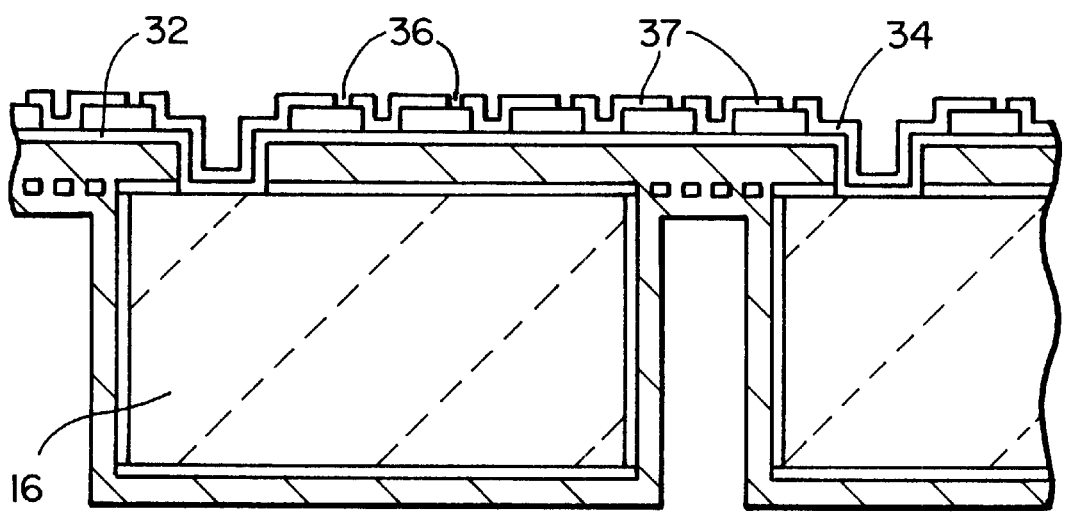
FIG_3.5

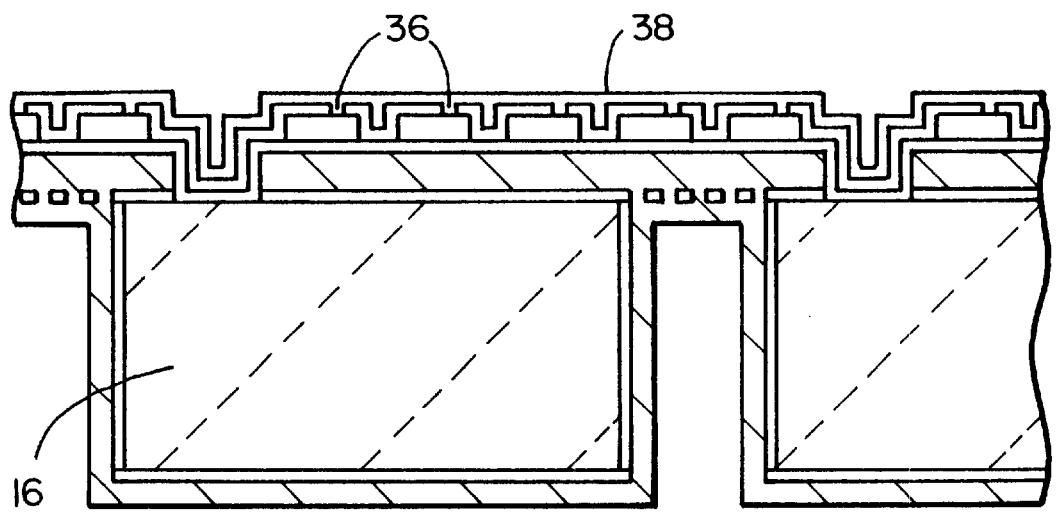
FIG_3.6
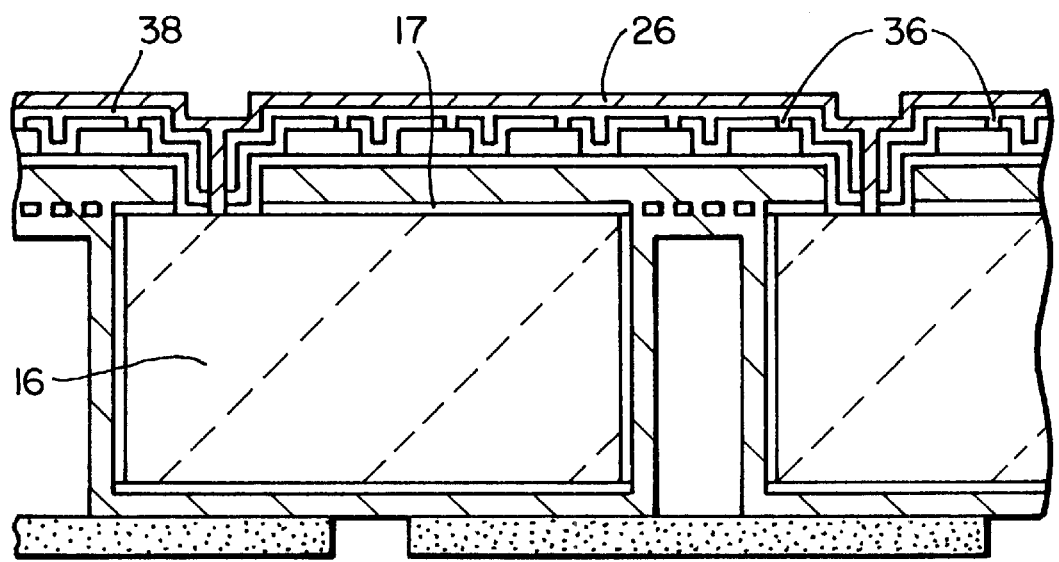
FIG_3.7

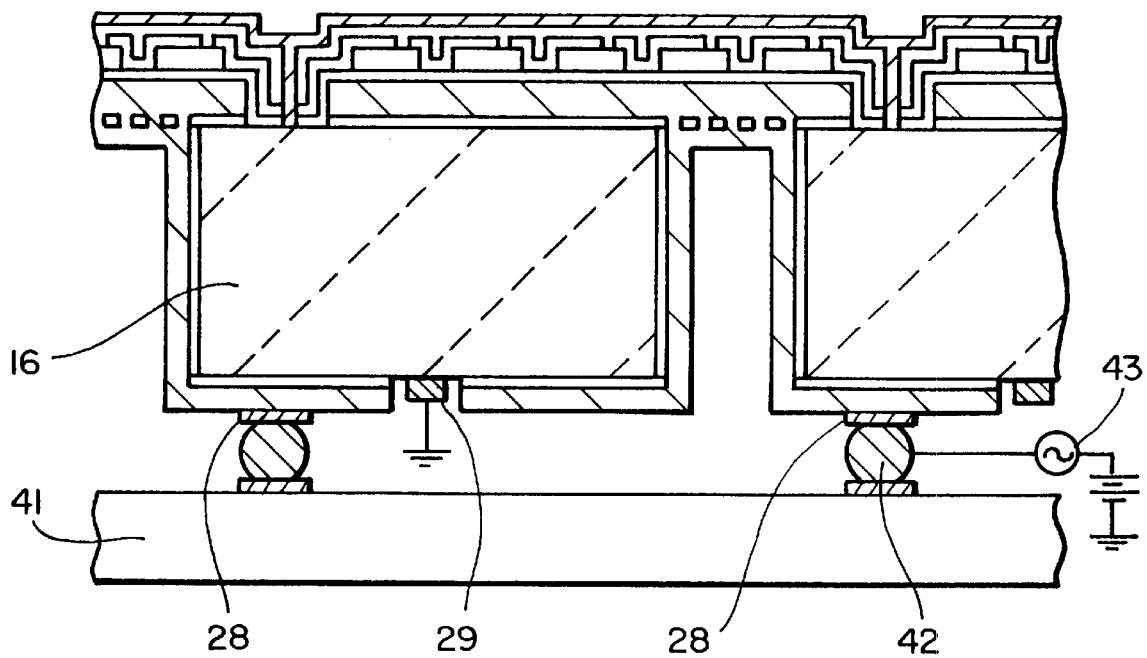
FIG_3.8
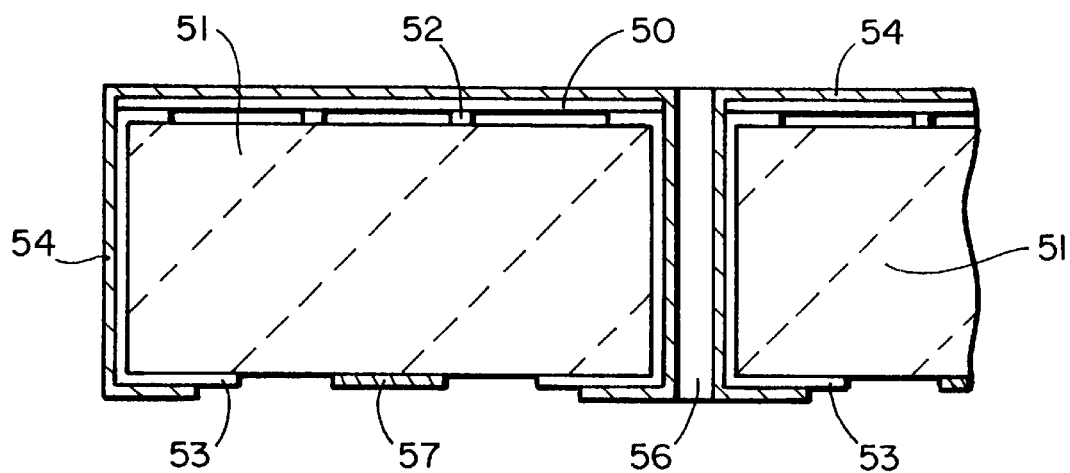
FIG_4

ARRAY OF CAPACITIVE MICROMACHINED ULTRASONIC TRANSDUCER ELEMENTS WITH THROUGH WAFER VIA CONNECTIONS

RELATED APPLICATIONS

This application claims priority to Provisional Application Ser. No. 60/158,254 filed Sep. 30, 1999.

GOVERNMENT SUPPORT

This invention was made with Government support under Contract No. N00014-98-1-0634, and N0014-96-1-1099 awarded by the Department of the Navy Office of Naval Research. The Government has certain rights to this invention.

BRIEF DESCRIPTION OF THE INVENTION

This invention relates generally to capacitive micromachined ultrasonic transducer arrays in which electrical connections are made to the individual array elements through vias extending through the wafer on which the array elements are formed.

BACKGROUND OF THE INVENTION

Capacitive micromachined ultrasonic transducers (cMUTs) have been emerging as an attractive alternative to piezoelectric transducers. They offer a larger set of parameters for optimization of transducer performance as well as ease of fabrication and electronic integration. The fabrication and operation of micromachined ultrasonic transducers have been described in many publications and patents. For example, U.S. Pat. Nos. 5,619,476; 5,870,351 and 5,894,452, incorporated herein by reference, describe the fabrication of capacitive-type ultrasonic transducers in which membranes are supported above a substrate by insulative supports such as silicon nitride, silicon oxide and polyamide. The supports engage the edges of each membrane to form cells. A voltage applied between the substrate and a conductive film on the surface of the membrane causes the cell membranes to vibrate and emit sound waves. The membranes can be sealed to provide operation of the transducers immersed in a liquid. Generally, the transducer includes a plurality of cells of the same or different sizes and/or shapes. In operation, multi-cell transducer elements are disposed in arrays with the electrical excitation of the elements controlled to provide desired beam patterns.

It is desirable to apply control voltages to the transducers from the back side of the wafer on which the transducers are formed. This is particularly true where one desires to integrate the cMUT array with the image processing electronics contained in a semiconductor chip or chips.

OBJECTS AND SUMMARY OF THE INVENTION

It is an object of the present invention to provide a cMUT array in which driving voltages are applied to the array element electrodes through the support wafer or substrate, and through vias formed on the support wafer or substrate.

It is another object of the present invention to provide a cMUT array which can be easily integrated with an image processing chip or chips.

There is provided a cMUT array which includes through wafer via connections to individual elements of the array, and to a cMUT array which can be integrated with image processing electronics formed in a separate chip of wafer.

BRIEF DESCRIPTION OF THE DRAWINGS

FIG. 1 is a schematic perspective view of a portion of a cMUT array incorporating the present invention.

FIG. 2 is a sectional view of an enlarged portion of a cMUT array showing one element and a part of a second element with a through wafer via connection.

FIGS. 3.1 through 3.8 show the steps in forming the transducer array of FIG. 2.

FIG. 4 is a sectional view showing another embodiment of the present invention.

DESCRIPTION OF THE PREFERRED EMBODIMENTS

A capacitive micromachined ultrasonic transducer array 11 is shown in FIG. 1. The array includes a number of individual transducer elements 12, each of which may include multiple cells 13 carried on substrate 14. By way of example, the cells 13 can be square, as shown, circular, rectangular or hexagonal, etc. Multiple cells are generally employed to form a transducer element 12, and multiple transducer elements are arranged in arrays. By selectively exciting the cells of the array element, the array element will emit ultrasound waves. By selectively exciting the elements of the array, the pattern of the ultrasound can be Controlled. The pattern or area can be electronically scanned by controlling the phase of the voltages applied to the array elements. In accordance with the present invention, electrical connection to the electrodes (not shown in figure) of the transducer elements 12 is made through vias formed in the wafer or substrate 14.

An enlarged cross-sectional view of two transducer elements 12 of a typical capacitive micromachined ultrasonic transducer array is shown in FIG. 2. The cMUT array includes a silicon substrate or wafer 16 with upper and lower silicon oxide layers 17 and 18. The wafer 16 is processed to form a through via 14 with a silicon oxide layer 19. A layer of conductive polysilicon 21 extends along the walls of the through via and on the surface of the upper silicon oxide layer 17, and on the bottom oxide layer 18. A silicon nitride layer 22 extends over the upper surface of the polysilicon layer to form individual membranes 23 which are sealed by a second silicon nitride layer 24. A conductive metal layer 26 is formed on the surface of the silicon nitride layers and provides an upper contact for the transducer. The metal layer extends down through openings 27 formed in the silicon nitride layer and to provide electrical connection to the silicon wafer 16. Metal contacts 28 are formed on the polysilicon layers 21 and a metal contact 29 is made to the silicon wafer. As a result, a voltage can be applied between the upper polysilicon layer which underlies the membranes, via the polysilicon layer formed in the through via 14, and an electrical connection is made to the upper metallic layer through the metal contact 29. As a result, excitation voltages can then be applied to the membranes, causing them to vibrate and generate ultrasound. The ultrasonic transducer array just described permits connection of the operating voltages to the bottom of the wafer providing ease of connections. Furthermore, the particular design can then be used to bond or connect the ultrasonic array to a signal-processing chip which may be an integrated circuit or other semiconductor circuit which includes all of the signal processing electronics to provide appropriate excitation voltages to the individual transducer elements. The transducer array may be connected to the associated semiconductor chip or chips which includes the operating electronics by solder bumps 42, FIG. 3.8, providing for ease of mounting and construction of the assembly.

The steps in forming the capacitive ultrasonic transducers for each of the elements of the array are set forth generally in FIGS. 3.1 through 3.8. Referring to FIG. 3.1, the silicon wafer 16 is processed to form the silicon oxide layers 17 and 18. This is followed by application of a photoresist 31, FIG. 3.2, to the bottom of the wafer, and selective etching to form the via 14. An oxide layer 19 is formed on the via walls. The photoresist is then removed and a polysilicon layer 21 is deposited and etched to lie along the walls of the via on the upper silicon oxide layer 17 and the lower silicon oxide layer 18. This is followed by the deposition of a silicon nitride layer 32 overlying the polysilicon layer 21 as shown in FIG. 3.4. This is then followed by forming an amorphous silicon layer on the upper surface and etching the layer to form a plurality of islands 33, FIG. 3.4. This step is followed by the deposition of another silicon nitride layer 34 which extends down and into contact with the silicon nitride layer 32 to enclose each of the amorphous silicon islands 33. This step is then followed by masking and etching to form holes 36 in the silicon nitride layer, FIG. 3.5, and etching to remove the amorphous silicon material leaving membranes 37 supported by the silicon nitride. This is followed by the application of a thin silicon nitride layer 38 to seal the holes or openings 36 in the membranes, FIG. 3.6. Next, by etching openings through the silicon nitride to expose the underlying silicon wafer 16 followed by deposition of a metal film 26, the upper contact for the membranes is formed. This is illustrated in FIG. 3.7. FIG. 3.7 also shows the step of applying a dry film photoresist to the bottom of the assembly, followed by etching and the deposition of a metallic contacts 28 and 29 providing connections to the polysilicon and to the wafer. Finally, in FIG. 3.8 the assembly can be mounted to a single processing chip 41 by suitable solder bumps 42 or other integrated circuit connection technology to form a unitary structure. The upper metal electrode 26 is connected to ground potential through the wafer. The upper polysilicon layer 21 is connected to the exciting voltage 43 through the via. The applied voltage causes the membranes to vibrate.

FIG. 4 illustrates another embodiment of the invention in which membranes 51 are supported at their edges above the wafer 52 by silicon oxide 53, which forms the walls of a cell 54 having the wafer as the lower wall and the membrane 51 as the upper wall. The vias 56 include an insulating oxide layer 56. A metal film 57 provides the upper electrode of the cells 54 and extends down the via over the oxide layer 56 to the bottom of the wafer. Contact 59 provides an electrical connection through the wafer to the upper surface which forms a second electrode. Operating voltages are applied to the transducer cell electrodes via the metal film and wafer.

Thus, there has been described a micromachined ultrasonic transducer array in which the operating voltages applied to the cell or element electrodes are applied from the bottom of the transducer through the support wafer and through vias.

The foregoing descriptions of specific embodiments of the present invention are presented for the purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An ultrasonic transducer array comprising a plurality of cMUT elements formed on one surface of a wafer, said cMUT elements including transducer cells having a membrane, a first electrode comprising a metal layer overlying said membranes, a second electrode spaced from the first electrode, vias extending through said wafer for connecting to one of the electrodes from the opposite surface of the wafer, and means for connecting through the wafer to the other electrode.

2. An ultrasonic transducer element comprising a substrate and a plurality of cells, each including a membrane, formed in the surface of said substrate with an electrode for exciting said cell membranes and another electrode spaced from the first membrane whereby a voltage can be applied between said electrodes characterized in that electrical connection is made to one of said electrodes through said substrate and electrical connection is made to said the other of electrodes through a conductor formed in a via extending through said substrate.

3. An ultrasonic transducer element as in claim 2 in which one of the electrodes is the upper surface of the substrate.

4. An ultrasonic transducer element as in claim 2 in which one of said electrodes is a polysilicon layer and said connection through the via is polysilicon.

5. An ultrasonic transducer element as in claim 2 in which the electrical connection through said via is metallic.

6. An array comprising a plurality of transducer elements formed on one surface of a semiconductor wafer, a first electrode connected to said transducer element, a second electrode spaced from the first electrode connected to said transducer element, a conductor insulated from and extending through a via in said wafer for connecting to one of the electrodes from the opposite surface of the wafer, and means for connecting through the wafer to the other electrode.

7. An array as in claim 6 in which the electrical connection through said via comprises a metallic layer separated from the wafer by an oxide layer.

8. A transducer including at least one active element having at least two electrodes formed on one surface of a semiconductor substrate, means electrically connecting to one of said electrodes from the other surface through the substrate, and means extending through vias formed in said substrate for providing an electrical connection from the other surface of the substrate to the other of said electrodes.

9. A transducer as in claim 8 in which the means extending through the via is semiconductive material.

10. A transducer as in claim 8 in which the means extending through the via is a metallic layer separated from the semiconductor substrate.

11. Transducers disposed on one surface of a semiconductor substrate and means for providing electrical connections to said transducers from the other surface of the substrate comprising vias formed in said substrate extending between said surfaces an oxide layer on the surface of the vias and a conductor formed on the oxide layer in the vias to provide the electrical connection to said transducers.

12. Transducers as in claim 11 in which the conductor is a metal.

* * * * *